United States Patent
Oh et al.

(10) Patent No.: US 11,117,684 B2
(45) Date of Patent: Sep. 14, 2021

(54) SEPARATION DEVICE USING POGO-PIN FOR DEPLOYABLE STRUCTURE OF CUBESAT

(71) Applicants: INDUSTRY-ACADEMIC COOPERATION FOUNDATION CHOSUN UNIVERSITY, Gwangju (KR); SOLETOP CO., LTD., Daejeon (KR)

(72) Inventors: Hyun Ung Oh, Daejeon (KR); Su Hyeon Kim, Gyeongsangnam-do (KR); Tae Yong Park, Gyeongsangnam-do (KR); Young Bo Sakong, Daejeon (KR); Hongrae Kim, Daejeon (KR)

(73) Assignees: INDUSTRY-ACADEMIC COOPERATION FOUNDATION CHOSUN UNIVERSITY, Gwangju (KR); SOLETOP CO., LTD., Daejeon (KR)

(*) Notice: Subject to any disclaimer, the term of this patent is extended or adjusted under 35 U.S.C. 154(b) by 389 days.

(21) Appl. No.: 16/193,195

(22) Filed: Nov. 16, 2018

(65) Prior Publication Data

US 2019/0367194 A1  Dec. 5, 2019

(30) Foreign Application Priority Data

Jun. 1, 2018  (KR) ........................ 10-2018-0063236

(51) Int. Cl.
*B64G 1/22*  (2006.01)
*B64G 1/64*  (2006.01)

(52) U.S. Cl.
CPC ............. *B64G 1/222* (2013.01); *B64G 1/645* (2013.01)

(58) Field of Classification Search
CPC ............................... B64G 1/222; B64G 1/645
See application file for complete search history.

(56) References Cited

U.S. PATENT DOCUMENTS 10,676,217 B2 * 6/2020 Spark .................... B64G 1/443

FOREIGN PATENT DOCUMENTS

| JP | 60-006000 U | 1/1985 |
|---|---|---|
| KR | 10-2009-0065151 A | 6/2009 |
| KR | 10-2016-0046304 A | 4/2016 |

OTHER PUBLICATIONS

Office action dated Jul. 2, 2019 from Korean Patent Office in a counterpart Korean Patent Application No. 10-2018-0063236 (all the cited references are listed in this IDS.) (English translation is also submitted herewith.).

* cited by examiner

*Primary Examiner* — Jessica B Wong
(74) *Attorney, Agent, or Firm* — The PL Law Group, PLLC (57) ABSTRACT

A separation device for a deployable structure is configured to use the pogo-pin to supply power for severing a restraining wire. The separation device may enable the deployable structure to be elastically separated by means of an elastic force exerted thereon by a spring and may enable a deployed state of the structure to be ascertained immediately after deployment.

12 Claims, 6 Drawing Sheets

SEPARATION DEVICE USING POGO-PIN FOR DEPLOYABLE STRUCTURE OF CUBESAT

CROSS REFERENCE TO RELATED APPLICATION

The present application claims priority to Korean Patent Application No. 10-2018-0063236, filed Jun. 1, 2018, the entire contents of which is incorporated herein for all purposes by this reference.

BACKGROUND

Field of the Invention

The present invention relates generally to a separation device for a deployable structure of a CubeSat. More particularly, the present invention relates to a separation device using a pogo-pin for a deployable structure of a CubeSat, the separation device being configured to use the pogo-pin to supply power for severing a restraining wire while enabling the deployable structure to be elastically separated by means of an elastic force exerted thereon by a spring and enabling a deployed state of the structure to be ascertained immediately after deployment.

Description of the Related Art

The rapid development of the space industry has led to the use of CubeSats for carrying out practical scientific missions. Such CubeSats can be used as an excellent tool for testing advanced space technologies used for practical satellites and thus are being actively developed as core space technologies.

However, CubeSats, which have constraints of limited space, are required to have integrated systems, so it is essential to develop a technology capable of simple and multi-functional implementation.

To overcome such limited space of CubeSats, a separation device configured to restrain a deployable structure during launch and to deploy and expand the deployable structure in orbit has been actively applied.

Figure 1:
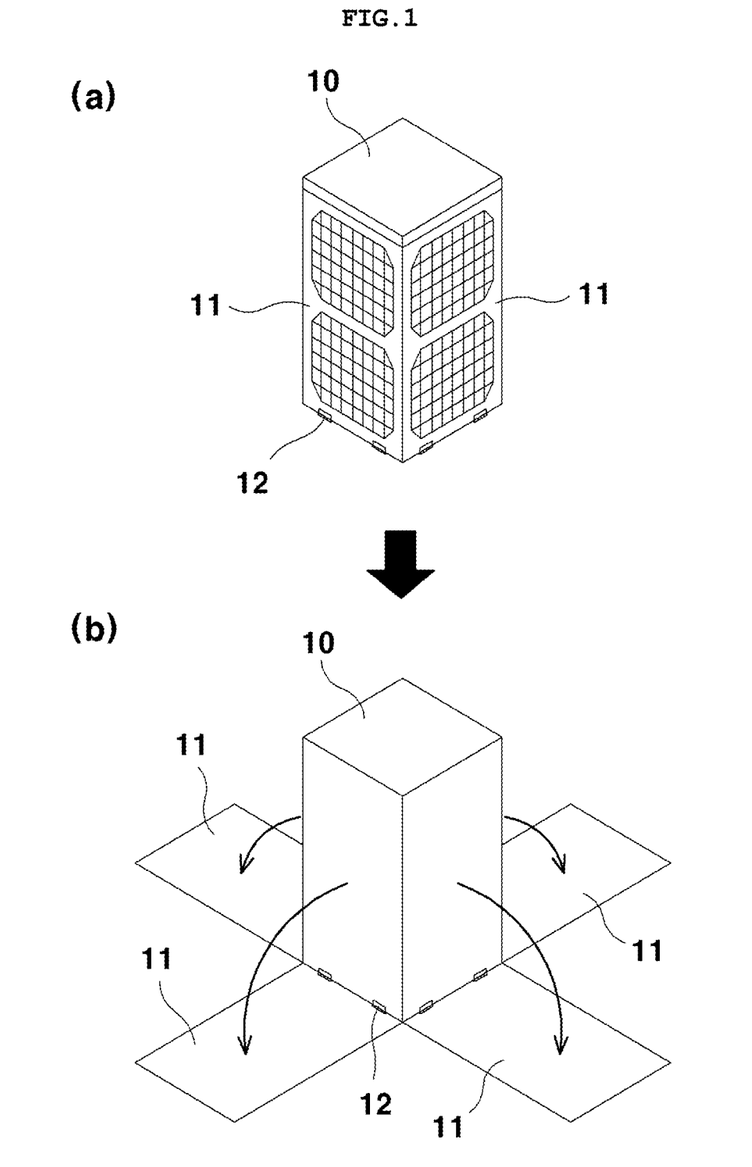
FIG. 1 are views showing a typical CubeSat.

(a) and (b) of FIG. 1 are views showing a typical CubeSat, wherein (a) of FIG. 1 shows a state where deployable structures 11 are restrained to a CubeSat 10, and (b) of FIG. 1 shows a state where the deployable structures 11 are released from a restraint and thus deployed.

In other words, the separation device for the deployable structure is a device for enabling the deployable structures 11 coupled to lower edges of the CubeSat 10 by hinges 12 to be folded against side surfaces of the CubeSat 10 for restraint and to be released from the restraint.

Meanwhile, a typical separation device for a deployable structure of a satellite in the related art is an explosive-type separation device which severs a connector by using explosives Maintaining posture stability and attenuating impacts due to the impacts generated upon explosion is difficult with such an explosive-type separation device, and there is a possibility that a loader, an electronic device, and the like are damaged due to the explosion impacts.

In fact, a design requirement of a CubeSat classified as an ultra-small satellite is to ensure that an explosive separation method must not be applicable.

Due to this, there is a need for the development and application of a non-explosive separation device with low separation impact and ease of use. Thus, a separation device for breaking restraining bolts by using the restoration characteristics of shape memory alloy (SMA) having shape memory effect according to heat application has been proposed.

The separation method using SMA has advantages over the explosive separation device, such as of relatively less impact, but has limited application due to the size and costs thereof and the limited weight of the CubeSat.

Thus, typically, a restraint and separation method using a restraining wire and a resistor is mainly applied to the CubeSat due to the limited space and weight of the CubeSat. However, such a restraint and separation method is problematic in that the deployable structures are permitted to be restrained only in an out-of-plane direction of the deployable structure and are difficult to be restrained in an in-plane direction of the structure. Additionally, a low fastening force along the in-plane direction restraint and complex workability makes it difficult to secure the structural integrity through restraint of the deployable structures in the launch environment, and a separate system must be constructed to obtain status information for determining whether deployment is performed.

The foregoing is intended merely to aid in the understanding of the background of the present invention, and is not intended to mean that the present invention falls within the purview of the related art that is already known to those skilled in the art.

SUMMARY

Accordingly, the present invention has been made keeping in mind the above problems occurring in the related art, and an aspect of the present invention is to provide a separation device for a deployable structure, the separation device having a small space requirement and enabling the deployable structure to be restrained both in in-plane and out-of-plane directions of the deployable structure.

Another aspect of the present invention is to provide a separation device for a deployable structure, the separation device initiating the deployment of deployable structure by means of elastic force exerted thereon upon separation and thus to be deployed rapidly.

Still another aspect of the present invention is to provide a separation device for a deployable structure, the separation device enabling a deployed state of the structure to be ascertained immediately after deployment without requiring provision of an additional system for checking the deployed state.

In order to achieve the above aspects, according to one aspect of the present invention, there is provided a separation device for a deployable structure, the separation device being configured to enable a deployable structure rotatably hinged to a lower end of a side surface of a CubeSat to be folded against the side surface of the CubeSat for restraint or to be separated therefrom for deployment and including: a printed circuit board provided at upper edges of the CubeSat and having a pogo-pin protruding outward; and a resistor board provided at an upper end of the deployable structure, the resistor board having an interface terminal coming into press contact with the pogo-pin when the deployable structure is folded against the side surface of the CubeSat and a resistor electrically connected with the interface terminal and generating heat when a current is supplied thereto from the pogo-pin, wherein the printed circuit board and the resistor board are configured such that a wire is wound thereon to cause the deployable structure to be restrained, and when the resistor supplies heat to the wire to sever the wire, the deployable structure is caused to spring back by means of an elastic force exerted thereon by the pogo-pin and thus to be unfolded and deployed from the side surface of the CubeSat.

In a preferred embodiment of the present invention, the deployable structure may be a solar panel, and the solar panel may be provided to be hinged to a lower end of each side surface of the CubeSat, the printed circuit board may have a square ring shape and is attached to the upper edges of the CubeSat, and the pogo-pin may be provided at a central portion of each edge of the printed circuit board.

In a preferred embodiment of the present invention, a pair of pogo-pins may be provided in parallel at each edge of the printed circuit board.

In a preferred embodiment of the present invention, the resistor board may have a pair of interface terminals provided to come into contact with the pogo-pins, the respective interface terminals being electrically connected with the resistor.

In a preferred embodiment of the present invention, the printed circuit board may have a first securing pin provided at each edge thereof and allowing the wire to be wound thereon.

In a preferred embodiment of the present invention, the resistor board may be secured to the upper end of the deployable structure by a bracket, the bracket having a second securing pin and a third securing pin that stand vertically to be distanced from each other and allow the wire to be wound thereon. The wire may be simultaneously wound on the first securing pin, the second securing pin, and the third securing pin, causing the deployable structure to be restrained.

In a preferred embodiment of the present invention, the printed circuit board may have a first securing pin insertion notch and a second securing pin insertion notch each formed at each edge thereof such that the second securing pin and the third securing pin are inserted into and seated in the notches, respectively.

In a preferred embodiment of the present invention, the printed circuit board may have a single power supply connector provided to supply power to the respective pogo-pins from an external power source.

The present invention has the following excellent effects.

According to the separation device for the deployable structure according to the present invention, the printed circuit board and the pogo-pin are adapted to restrain the deployable structure both in the out-of-plane direction and in the plane direction while achieving a small space and weight requirement.

Furthermore, according to the separation device for the deployable structure according to the present invention, the deployable structure is caused to spring back upon separation by means of the elastic force exerted thereon by the pogo-pin, thus achieving rapid deployment.

Furthermore, according to the separation device for the deployable structure according to the present invention, a current flow state of the pogo-pin is checked, thus enabling the deployed state of the deployable structure to be ascertained immediately after deployment without requiring provision of the additional system for checking the deployed state.

BRIEF DESCRIPTION OF THE DRAWINGS

The above and other aspects, features and other advantages of the present invention will be more clearly understood from the following detailed description when taken in conjunction with the accompanying drawings, in which.

DETAILED DESCRIPTION

Although the terms used in the description of the present invention are selected from generally known and used terms, some of the terms mentioned in the description of the present invention have been selected by the applicant, the detailed meanings of which should be understood not simply by the actual terms used, but by the meaning of each term as desired in the detailed description of the invention and/or in consideration of the meanings used.

Hereinafter, a detailed description will be given for the technical configuration of the present invention with reference to embodiments illustrated in the accompanying drawings.

However, the present invention is not limited to such embodiments and may be achieved in other ways. The same reference numerals will be used throughout the drawings and the description to refer to the same or like elements or parts.

Figure 2:
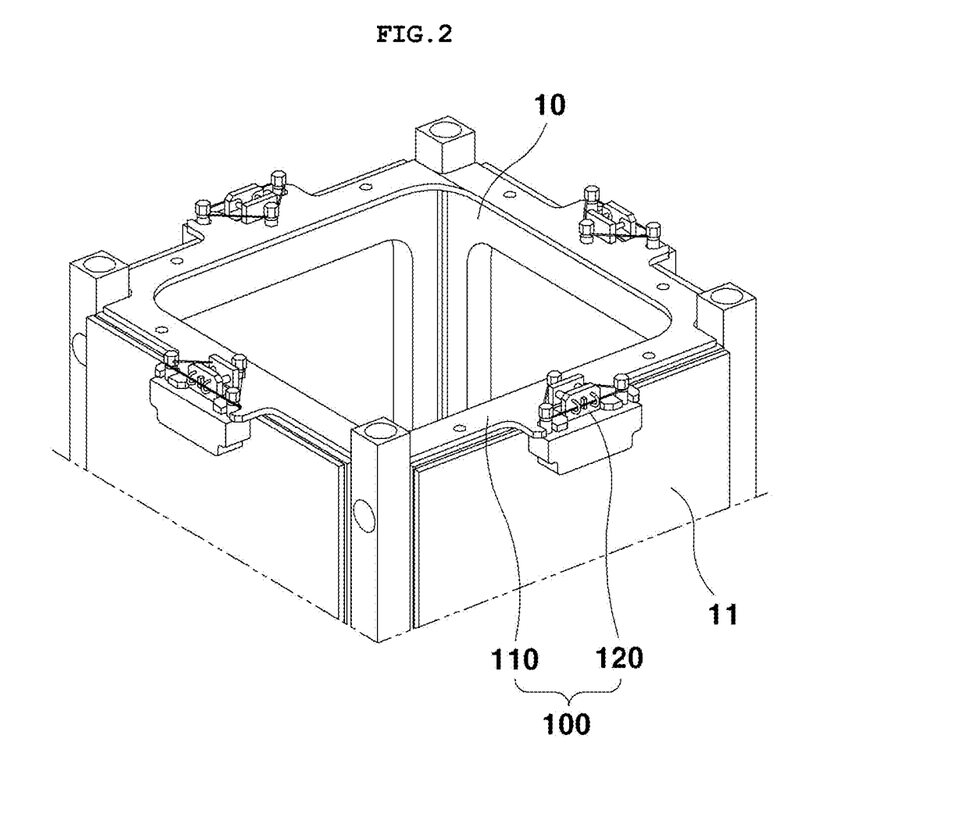
FIG. 2 is a view showing a state where a separation device for a deployable structure according to an embodiment of the present invention restrains the deployable structure.
Figure 3:
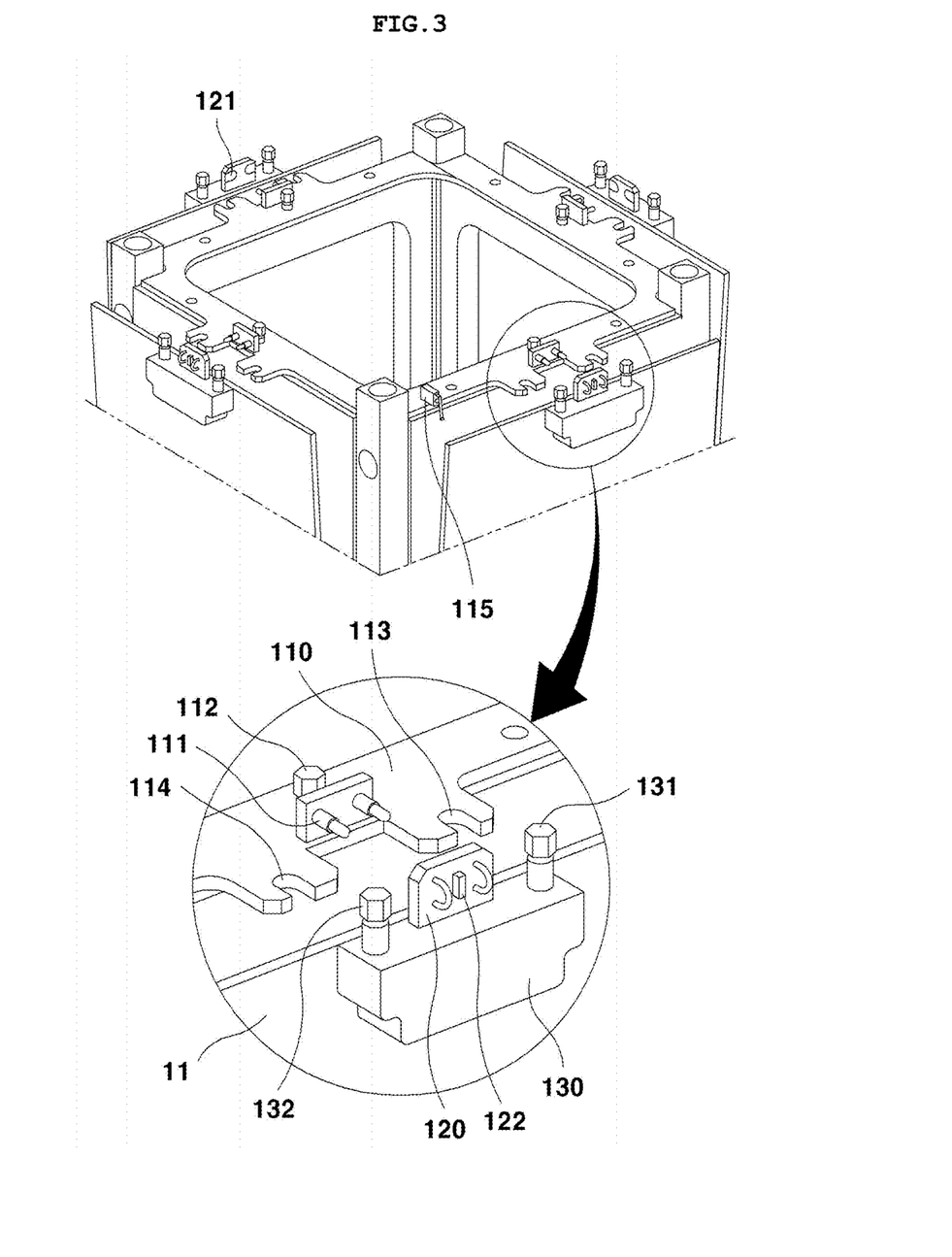
FIG. 3 is a view showing a state where the separation device for the deployable structure according to the embodiment of the present invention separates and releases the deployable structure from restraint.
Figure 4:
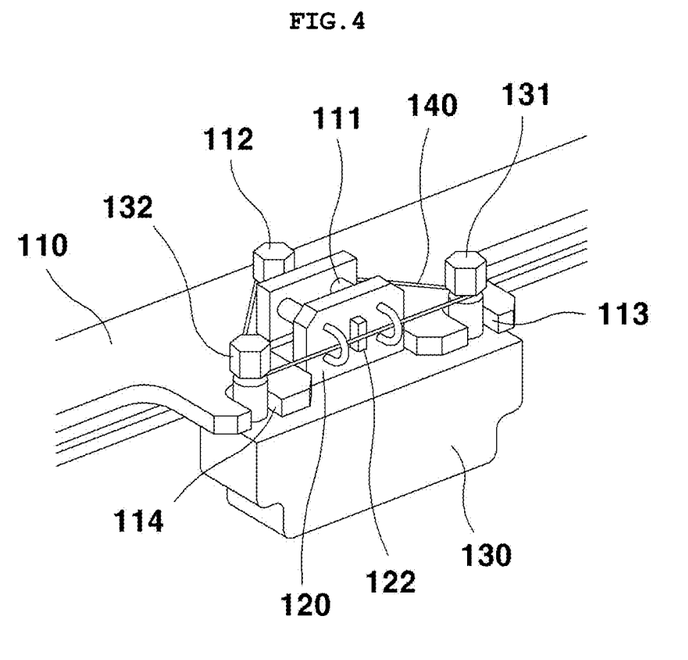
FIG. 4 is an enlarged view showing the state where the separation device for the deployable structure according to the embodiment of the present invention restrains the deployable structure.
Figure 5:
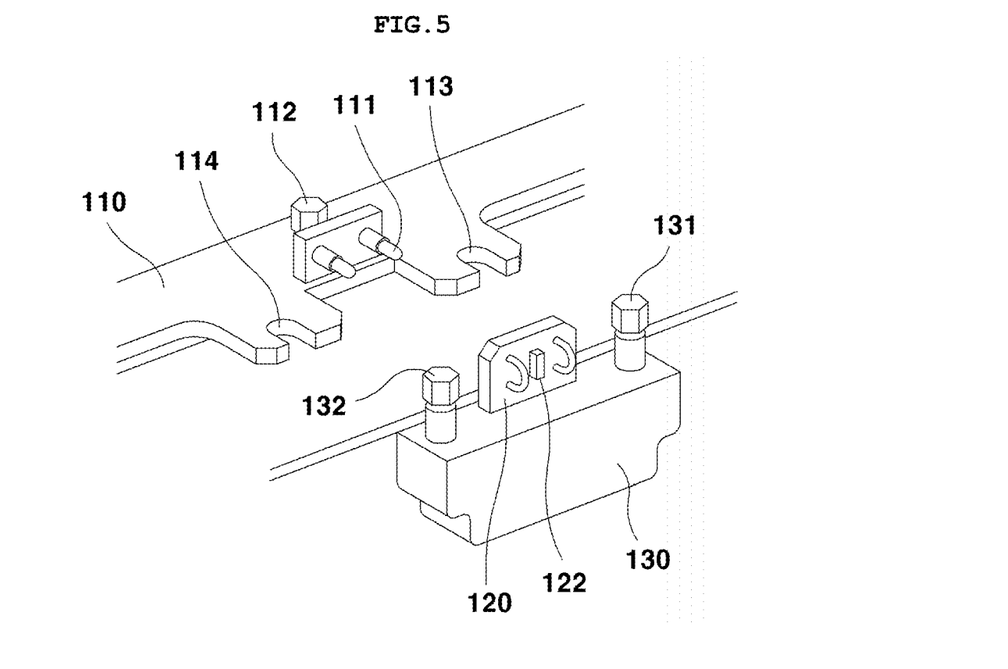
FIG. 5 is an enlarged view showing the state where the separation device for the deployable structure according to the embodiment of the present invention releases the deployable structure from restraint.

Referring to FIGS. 2 to 4, a separation device 100 for a deployable structure according to an embodiment of the present invention is a device that enables a deployable structure 11 rotatably hinged to a lower end of a side surface of a CubeSat 10 to be folded against the side surface of the CubeSat 10 for restraint or to be separated therefrom for deployment.

Furthermore, the deployable structure 11 may be a solar panel that supplies power to the CubeSat 10.

The separation device 100 for the deployable structure includes a printed circuit board 110 and a resistor board 120.

The printed circuit board 110 is a PCB substrate provided at upper edges of the CubeSat 10.

Furthermore, the printed circuit board 110 is provided with a pogo-pin 111 protruding outward.

The pogo-pin 111 is a connection terminal for performing electrical conduction between two circuit boards and is configured with a cylindrical housing, a piston-shaped connection terminal linearly movable into the housing, and a spring provided inside the housing to elastically support the connection terminal outward.

Furthermore, the pogo-pin 111 is provided as a pair of pogo-pins 111 distanced from each other, one of which is used as a (+) terminal and the other is used as a (−) terminal.

Furthermore, the pogo-pin 111 may be provided according to the number of deployable structures 11. If the CubeSat 10 has four sides surfaces each having the deployable structure 11, the CubeSat 10 has four upper edges each having the pogo-pin 111.

In this case, the printed circuit board 110 is formed into a square ring shape and attached to the upper edges of the CubeSat 10, and each pair of pogo pins 111 protrude outward from a central portion of each edge of the printed circuit board 110.

The resistor board 120 is provided at an upper end (upper end in a folded state) of the deployable structure 11 and includes an interface terminal 121 coming into contact with the pair of pogo-pins to be in electrical contact therewith and a resistor 122 electrically connected with the interface terminal 121 and generating heat when a current is applied thereto.

Furthermore, the resistor board 120 may be secured to the upper end of the deployable structure 11 by a bracket 130.

Meanwhile, the printed circuit board 110 and the resistor board 120 are restrained to each other by a wire 140 melted by heat and severed. The resistor 122 supplies heat to the wire 140 to sever the wire, causing the deployable structure 11 to spring back by means of a spring elastic force exerted thereon by the pogo pins 111 and thus to be unfolded and deployed from the side surface of the CubeSat 10.

Furthermore, the printed circuit board 110 has a first securing pin 112 standing vertically and allowing the wire 140 to be wound thereon, while the bracket 130 has a second securing pin 131 and a third securing pin 132 that stand vertically to be distanced from each other with the resistor board 120 interposed therebetween and allow the wire 140 to be wound thereon.

In other words, the wire 140 is simultaneously wound on the outer peripheries of the first securing pin 112, the second securing pin 131, and the third securing pin 132 to form a loop configuration, causing the deployable structure 11 to be restrained.

Furthermore, the wire 140 is simultaneously wound on the first securing pin 112, the second securing pin 131, and the third securing pin 132 while being in contact with the resistor 122.

Thus, the wire 140 causes the deployable structure 11 to be restrained in a direction of rotation of the deployable structure 11.

Meanwhile, the deployable structure 11 may rotate in a lateral direction on the side surface of the CubeSat 10, in which case a lower hinge may be broken and thus separated from the CubeSat 10.

Thus, the present invention provides a first securing pin insertion notch 113 and a second securing pin insertion notch 114 each formed at each edge of the printed circuit board 110 such that when the deployable structure 11 is folded, the second securing pin 131 and the third securing pin 132 are inserted into and seated in the notches, respectively. This makes it possible to prevent the deployable structure 11 from rotating in the lateral direction in a restrained state (rotating about the axis perpendicular to the side surface of the CubeSat).

In other words, the separation device 100 for the deployable structure according to the embodiment of the present invention enables the deployable structure 11 to be restrained both in the direction of rotation and in the lateral direction, achieving a significant improvement of the stability of restraint.

Furthermore, the printed circuit board 110 has a power supply connector 115 provided to supply power to the respective pogo-pins 111. The respective pogo-pins 111 are electrically connected to each other on the printed circuit board 110, so it is sufficient that the connector 115 is a single connector. Accordingly, this is advantageous in overcoming constraints of the space and weight of the CubeSat.

Furthermore, the pogo-pins 111 are configured to have no current flowing therethrough when the deployable structure 11 is separated and thus also serves as switches for checking whether the deployable structure 11 is deployed. Accordingly, this is advantageous in that there is no need an additional system for checking whether deployment is performed.

Figure 6:
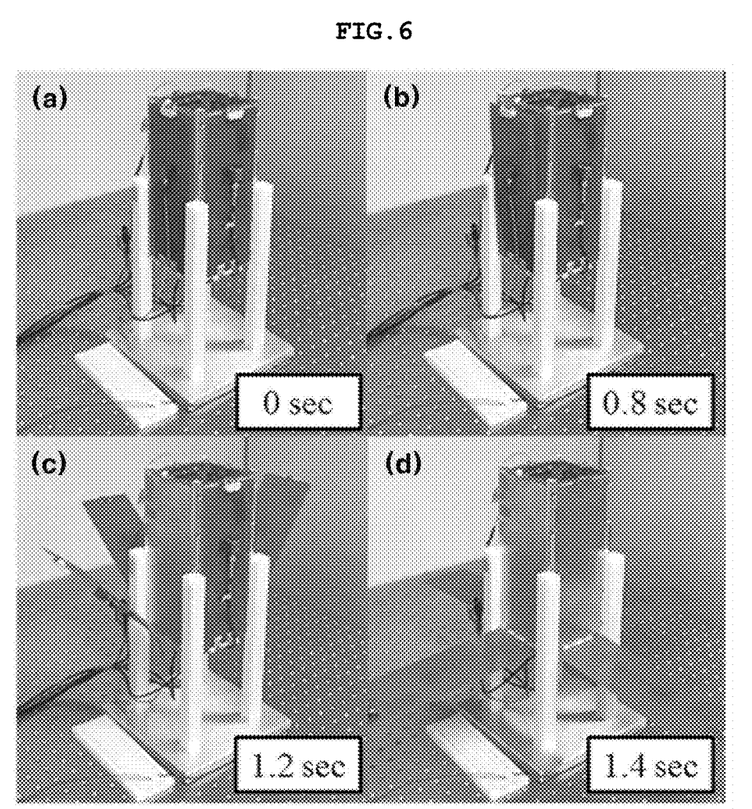
FIG. 6 is a view showing results of a separation test for the separation device for the deployable structure according to the embodiment of the present invention.

FIG. 6 is a view showing results of a separation test for the separation device for the deployable structure according to the embodiment of the present invention.

Referring to FIG. 6, as a result of an operation function test when a voltage of 8 V is applied to the pogo-pins 111, a solar panel was first deployed in 0.8 seconds, and all the solar panels were deployed in 1.4 seconds.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A separation device for a deployable structure of a CubeSat, the separation device being configured to enable the deployable structure to rotatably hinged at a lower end of a side surface of the CubeSat and to be folded against the side surface of the CubeSat for restraint or to be separated therefrom for deployment, the separation device comprising:
a printed circuit board provided at upper edges of the CubeSat, the printed circuit board having a pogo-pin protruding outward; and
a resistor board provided at an upper end of the deployable structure, the resistor board having an interface terminal coming into press contact with the pogo-pin when the deployable structure is folded against the side surface of the CubeSat and a resistor electrically connected with the interface terminal and generating heat when a current is supplied thereto from the pogo-pin,
wherein the printed circuit board and the resistor board are configured such that a wire is wound thereon to cause the deployable structure to be restrained, and
when the resistor supplies heat to the wire to sever the wire, the deployable structure is caused to spring back by an elastic force exerted thereon by the pogo-pin and thus to be unfolded and deployed from the side surface of the CubeSat.

2. The separation device of claim 1, wherein the deployable structure is a plurality of solar panels, and each solar panel is provided to be hinged to a corresponding lower end of each side surface of the CubeSat,
the printed circuit board has a square ring shape and is attached to the upper edges of the CubeSat, and
the pogo-pin is a plurality of pogo-pins, each provided at a central portion of each edge of the printed circuit board.

3. The separation device of claim 2, wherein a pair of pogo-pins are provided in parallel at each edge of the printed circuit board.

4. The separation device of claim 3, wherein the resistor board has a pair of interface terminals provided to come into contact with the pogo-pins, the respective interface terminals being electrically connected with the resistor.

5. The separation device of claim 2, wherein the printed circuit board has a first securing pin provided at each edge thereof and allowing the corresponding wire to be wound thereon.

6. The separation device of claim 5, wherein resistor board is secured to the upper end of the deployable structure by a bracket, the bracket having a second securing pin and a third securing pin that stand vertically to be distanced from each other and allow the wire to be wound thereon, and the wire is simultaneously wound on the first securing pin, the second securing pin, and the third securing pin, causing the deployable structure to be restrained.

7. The separation device of claim 6, wherein the printed circuit board has a first securing pin insertion notch and a second securing pin insertion notch formed at each corresponding edge thereof such that the second securing pin and the third securing pin are inserted into and seated in the notches, respectively.

8. The separation device of claim 2, wherein the printed circuit board has a single power supply connector provided to supply power to the respective pogo-pins from an external power source.

9. A CubeSat having the separation device of claim 1, wherein the printed circuit board is mounted at upper edges of the CubeSat, and the resistor board is mounted at an upper end of the deployable structure.

10. The CubeSat of claim 9, wherein the deployable structure is a solar panel, and the solar panel is provided to be hinged to a lower end of each side surface of the CubeSat, the printed circuit board has a square ring shape and is attached to the upper edges of the CubeSat, and each pogo-pin is provided at a central portion of each edge of the printed circuit board.

11. The CubeSat of claim 10, wherein a pair of pogo-pins are provided in parallel at each edge of the printed circuit board.

12. The CubeSat of claim 10, wherein the printed circuit board has a single power supply connector provided to supply power to the respective pogo-pins from an external power source.

* * * * *